United States Patent [19]

Buswell et al.

[11] 4,156,211

[45] May 22, 1979

[54] THIN FILM MICROWAVE VOLTAGE CONTROLLED OSCILLATOR

[75] Inventors: Ronald N. Buswell, Santa Cruz; Willem A. Evers, Capitola; William D. Heichel, Santa Cruz, all of Calif.

[73] Assignee: Watkins-Johnson Company, Palo Alto, Calif.

[21] Appl. No.: 851,458

[22] Filed: Nov. 14, 1977

[51] Int. Cl.² .............................................. H03B 5/18
[52] U.S. Cl. ................................. 331/117 D; 333/246
[58] Field of Search ..................... 330/307; 333/84 M; 331/117 D, 101, 96

[56] References Cited

U.S. PATENT DOCUMENTS

| 3,377,568 | 4/1968 | Kruse, Jr. et al. | 331/117 D |
| 3,939,429 | 2/1976 | Lohn et al. | 325/432 |
| 4,010,428 | 3/1977 | Sunkler | 331/117 D |

OTHER PUBLICATIONS

"Microwave Transistor Oscillators", G. Hodowaner, Microwave JN., Jun. 1974, pp. 39–42, 62.
"Microstrip Amplifiers Can Be Simple", Electronic Design, Jul. 18, 1971.

Primary Examiner—John Kominski
Attorney, Agent, or Firm—Flehr, Hohbach, Test, Albritton & Herbert

[57] ABSTRACT

A microwave oscillator including a tuning varactor and a transistor in a thin film series resonant circuit.

2 Claims, 7 Drawing Figures

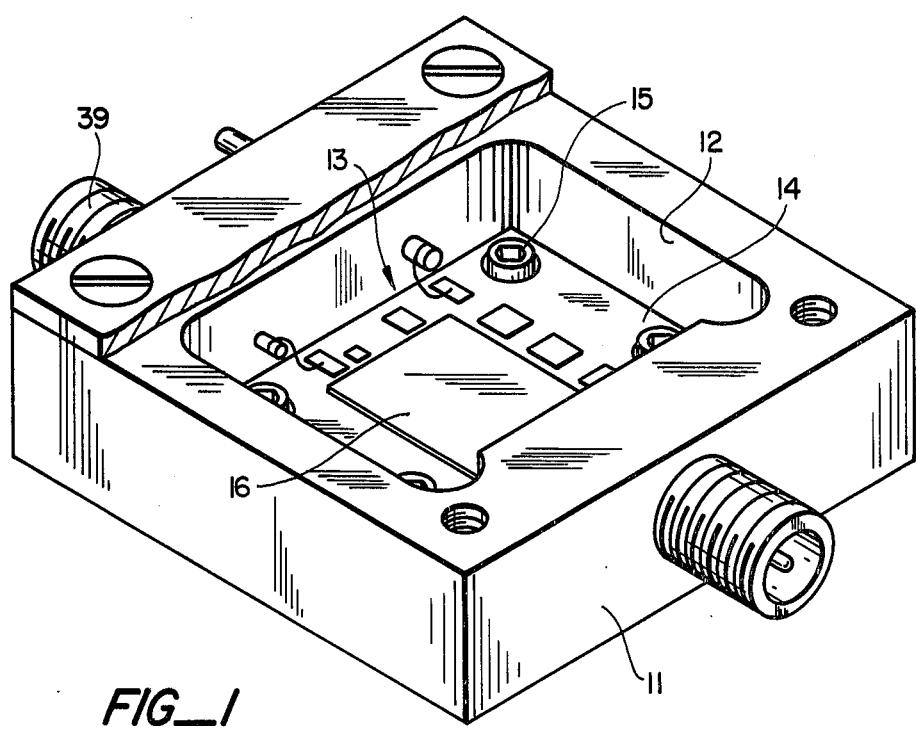
FIG_1
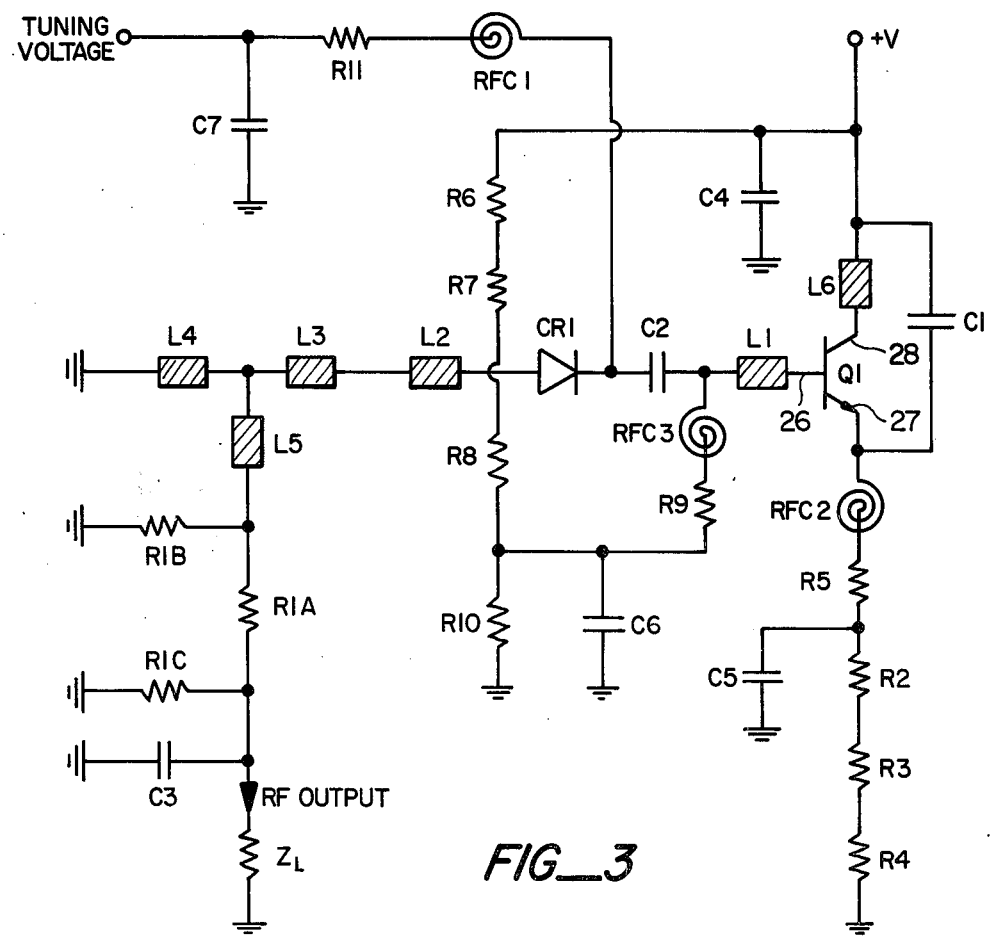
FIG_3

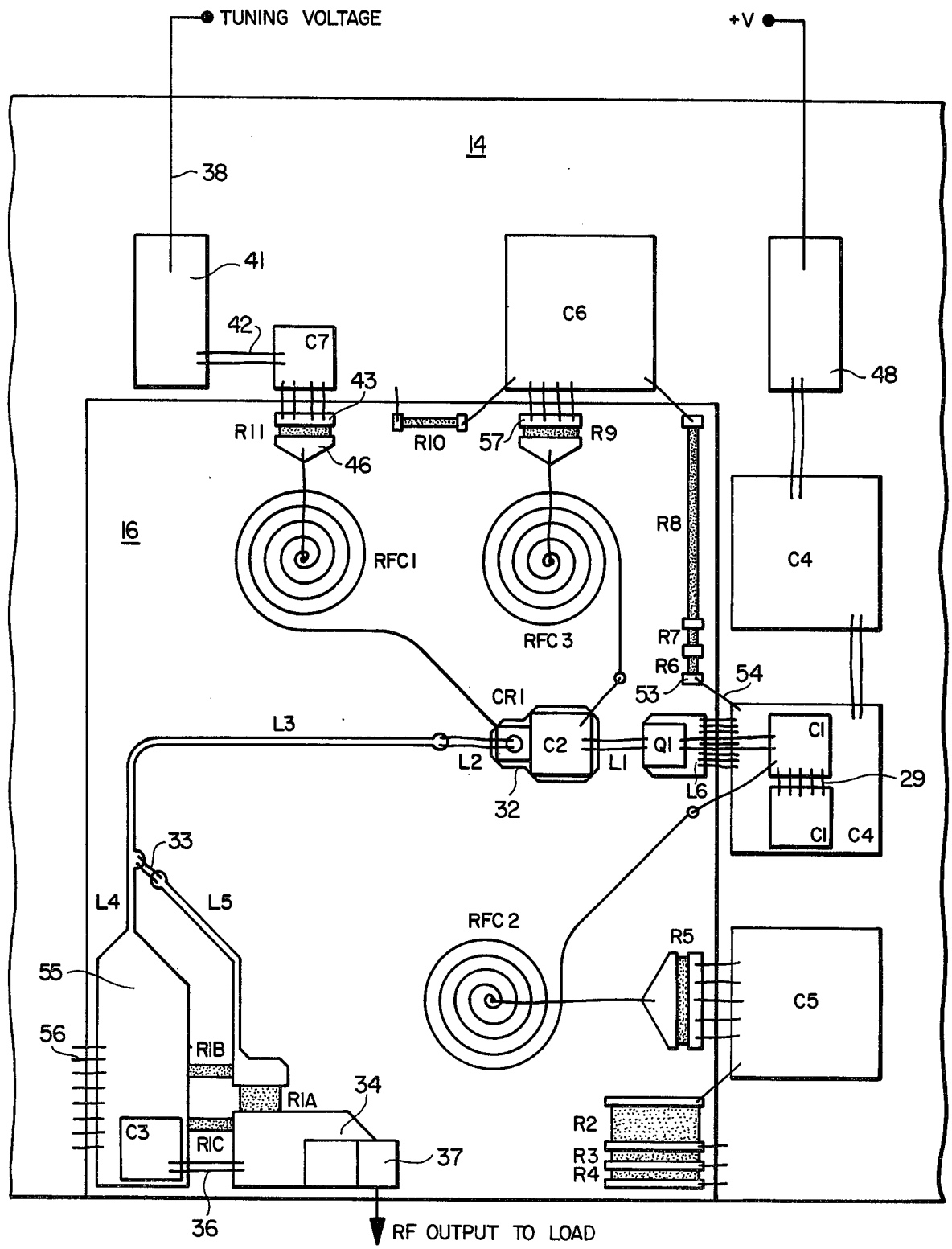
FIG_2

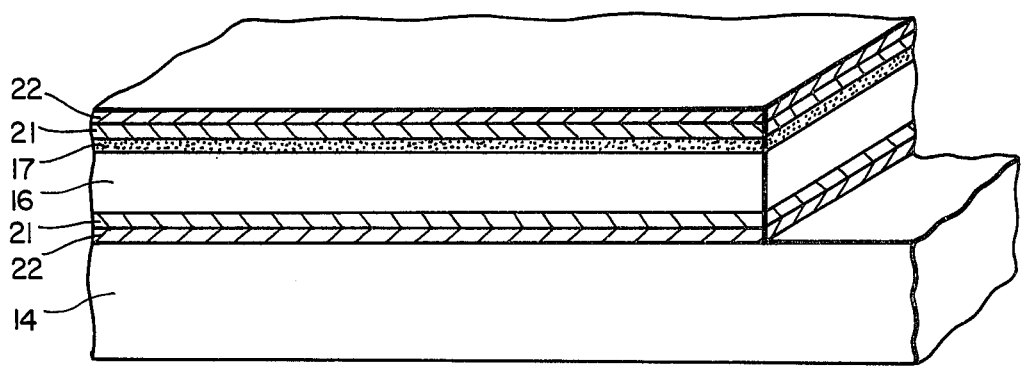
FIG_4A
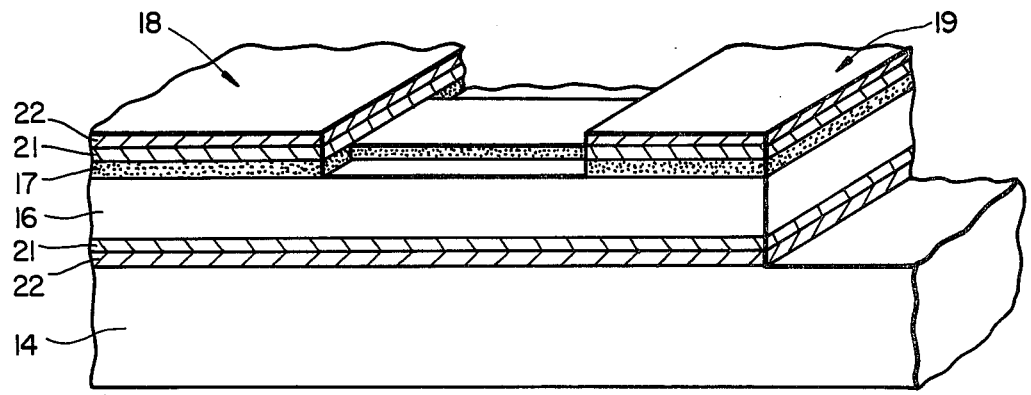
FIG_4B
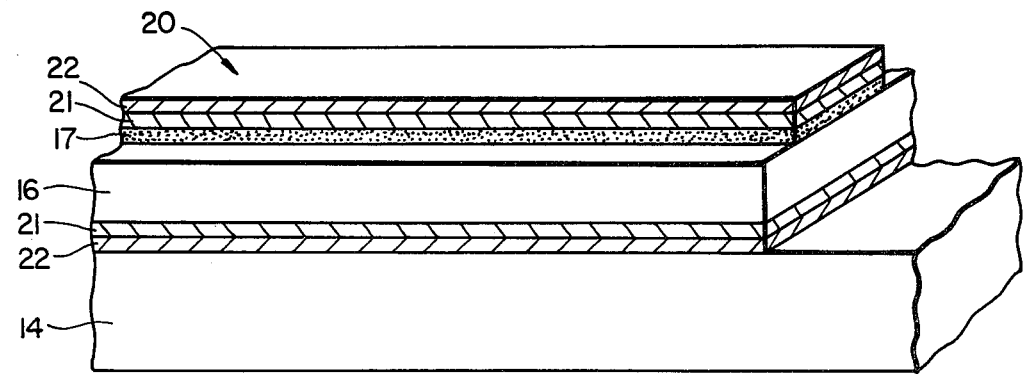
FIG_4C
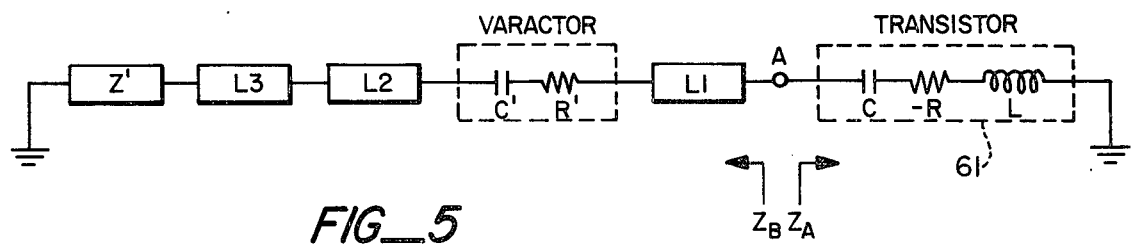
FIG_5

THIN FILM MICROWAVE VOLTAGE CONTROLLED OSCILLATOR

BACKGROUND OF THE INVENTION

This invention relates generally to voltage controlled oscillators and more particularly to thin film microwave oscillators.

Lumped constant series tuned varactor oscillator circuits are known. At lower frequencies such circuits are capable of being tuned over a broad frequency range. However, lumped constant circuits are not suitable for tuning over a wide band of microwave frequencies.

OBJECTS AND SUMMARY OF THE INVENTION

It is a general object of the present invention to provide a thin film microwave voltage controlled oscillator capable of being tuned over an octave frequency range.

It is a further object of the present invention to provide a thin film microwave voltage controlled oscillator employing a tuning varactor and a transistor in a series tuned resonant circuit.

It is another object of the present invention to provide a thin film voltage controlled oscillator which is simple in construction.

The foregoing and other objects of the invention are achieved by a voltage controlled oscillator including a ground plane, a ceramic substrate mounted on said ground plane, a transistor having emitter, collector, and base electrodes mounted on said substrate, thin film resistors and transmission line section formed on said substrate and interconnected to form an emitter bias circuit, thin film resistors and transmission line section formed on said substrate and interconnected to form a bias circuit, a varactor mounted on said substrate and having one terminal serially connected through a capacitor to said base electrode, thin film resistors and transmission line section formed on said substrate connected to said one varactor terminal to form a varactor bias circuit, and an output circuit connected serially to the other terminal of said varactor, said circuit comprising thin film transmission line sections and a thin film resistor output attenuator.

BRIEF DESCRIPTION OF DRAWINGS

FIG. 1 is a perspective view of a thin film voltage tuned oscillator in accordance with the present invention.

FIG. 2 is an enlarged view of the thin film oscillator circuit shown in FIG. 1.

FIG. 3 is a schematic diagram of the thin film circuit of FIGS. 1 and 2.

FIG. 4A-C shows the formation of thin film resistor and thin film connections of the type used in the circuit of FIGS. 1-3.

FIG. 5 is a simplified diagram showing the transistor and varactor modeled as resistors, capacitors and inductors with associated circuits showing the oscillator circuit in simplified form.

DESCRIPTION OF THE PREFERRED EMBODIMENTS

Referring generally to FIG. 1, the thin film voltage controlled oscillator includes a housing 11 which may be aluminum or the like provided with a cavity 12 for receiving the thin film circuit 13. A ground plane 14 is suitably secured to the housing by means of screws 15. A substrate 16, which may be suitable ceramic material such as berylium oxide or aluminum oxide is provided with thin film resistors, inductors and interconnecting leads. The substrate also serves to mount the discrete varactor, transistor, and capacitors which may be in the form of unpackaged chips which are either soldered or eutectically die attached to the thin film circuit. Wire leads interconnect the chips and the other parts of the circuit to one another.

Referring now particularly to FIG. 4, the substrate 16 with deposited thin film layers 17, 21, and 22 is shown brazed or epoxied to a metal ground plane 14. Thin film components are formed on the substrate by the selective etching of thin film layers 17, 21 and 22 which have been deposited over the entire surface of the substrate by sputtering or other means. The thin film layer 17 is a resistive layer which may be tantalum nitride. The layer 17 is covered by a migration arresting, conductive barrier layer 21 and a conductive layer 22 which may be gold. On the bottom of the substrate 16, the thin film layers are a migration arresting, conductive barrier layer 21 and a conductive layer 22 which may be gold. Selective etching of the top thin film layers is accomplished by providing the surface of the conductive layer with a mask to define the various conductive paths. The conductive and barrier layers are etched away in the unmasked areas to expose the resistive layer. Thereafter, the resistive layer is masked and etched away in the unmasked areas. In this manner, thin film resistors may be formed by leaving a resistive film 17 between two conductive leads 18 and 19 each including portions of layers 21 and 22. Etching through the resistive layer as well as the layers 21 and 22 allows the formation of microstrip transmisson line sections 20 which may be used to form microwave distributed inductors and capacitors or low frequency conductive leads.

With the foregoing explanation, reference is now made to FIGS. 2 and 3 wherein a thin film voltage controlled oscillator circuit is shown. Reference numerals are applied to like parts in FIGS. 2 and 3 which show the thin film circuit and the equivalent schematic circuit respectively.

The transistor chip $Q_1$ is bonded to the substrate. The transistor includes base, emitter and collector electrodes 26, 27 and 28. The emitter electrode is connected to one terminal of capacitor C1 which may include two or more chips interconnected by lead bonds 29 and mounted on a capacitor C4 mounted on the ground plane 14. The common terminal of the capacitor C1 and C4 is connected to the collector by leads L6.

The base of the transistor is connected by leads L1 to one terminal of capacitor C2. The other terminal of a capacitor C2 is connected to one terminal of the varactor CR1 by the thin film pad 32 carried on the substrate. Leads L2 connect the other terminal of the varactor to the thin film transmission line section L3 which becomes thin film transmission line section L4 which has an enlarged portion 55. The thin film transmission line section L4 is connected by suitable leads 33 to the thin film transmission line section L5. The enlarged portion 55 is connected by lead 56 to the ground plane 14. The thin film transmission line section L5 is connected to the grounded enlarged portion 55 by thin film resistor R1B. A resistor R1A connects the thin film transmission line section L5 to a thin film transmission line section 34 which in turn is connected by resistor R1C to the grounded enlarged portion 55. The thin film transmission line section 34 is also connected to the ground via capacitor C3 mounted on the grounded enlarged portion 55 and connected via leads 36 extending between the upper terminal of the capacitor and the thin film transmission line section 34. The RF output connection is made by gold ribbon 37 between the output coaxial connector center conductor and thin film transmission line section 34 and is shown in the schematic diagram as connected to a grounded load $Z_L$. The thin film transmission line section L5, resistors R1B, R1A, R1C and capacitor C3 form an output circuit which includes an attenuator to provide load impedance matching and load isolation whereby the oscillator is desensitized to variations in the load impedance. The capacitor C3 forms a low pass filter which attenuates harmonically related signals generated by the oscillator.

A tuning voltage is applied to one terminal of the varactor CR1 by having the center lead 38 of the coaxial connector 39 of FIG. 1 connected to an insulated conductive pad 41. The pad 41 is bonded to the upper terminal of capacitor C7 by the leads 42 with the other terminal of the capacitor C7 connected to the ground plane. The upper terminal of capacitor C7 is bonded to conductive thin film lead 43 by suitable bonding leads. The thin film lead 43 is in turn connected to the conductive lead 46 via thin film resistor R11. The RF choke RFC1 is formed as a thin film, spiral transmission line section of suitable length with the outer convolution of the spiral connected to one terminal of the varactor CR1 and the center convolution connected to the resistor R11 by a bonding lead.

Operating voltage +V is applied to pad 48 which is suitably connected to the upper terminal of capacitor C4. The lower terminal of the capacitor is connected to ground. The leads L6 connect the voltage source +V to the transistor collector. Base bias is derived from the voltage source by connecting the upper terminal of the capacitor C4 to the conductive thin film line 53 by a lead 54. Conductive leads or pads are shown interconnecting resistors R6, R7 and R8. The end of resistor R8 is connected to the upper terminal of capacitor C6 whose lower terminal is connected to the ground plane. The upper terminal of C6 is connected to one terminal of thin film resistor R10 and the other terminal of R10 is connected to ground. The upper terminal of C6 is also bonded to the conductive lead 57 which connects to one side of the resistor R9. The other side of the resistor R9 is connected to the center convolution of thin film spiral transmission line section choke RFC3 by a bonding lead. The outer convolution is connected to the upper terminal of the capacitor C2 and base of the transistor Q1 by bonding leads. This combination of transmission line section, bypass capacitor and resistors provides the proper bias for the transmission base.

The emitter bias is provided by thin film spiral transmission line section choke RFC2 connected by lead bonds to C1 and to ground via the serial connection of resistors R5, R2, R3, and R4 which are in the form of thin film resistors with suitable conductive thin film interconnections. The common terminal between the resistors R5 and R2 is connected to ground via capacitor C5 to form a high frequency bypass circuit for the emitter bias.

The RF chokes, RFC 1, RFC 2 and RFC 3 are spiral microstrip transmission lines which are terminated in an RF short circuit (bypass capacitor) through a small thin film resistor and structured in length to present high impedances to the RF circuit. The chokes allow bias voltages to be inserted into the RF circuit with minimum perturbation.

The resistors, R2-R11, adjust the bias to the transistor Q1 which is biased in an emitter follower configuration. R5, R9, and R11 also serve to eliminate small parasitic resonances in the choke circuitry. The capacitors C4-C7 are RF bypass capacitors. C2 is a DC blocking capacitor and is essentially a short circuit at microwave frequencies.

Thus it is seen that a relatively simple interconnecting circuit is formed with the interconnecting leads, resistors and transmission line sections formed as thin film elements. Varactor, transistor and capacitor chips are interconnected therewith. The structure is easily and repeatably formed by thin film techniques.

A schematic of just the microwave series resonant circuit is shown in FIG. 5 with the transistor and varactor modeled using their equivalent microwave circuits.

When connected in essentially a common collector configuration with an RF choke in the emitter and a collector-to-emitter capacitor, the transistor's RF impedance from the base terminal to ground can be modeled as a series negative resistor, capacitor and inductor shown in the dotted block 61, FIG. 5. The resistance is negative due to the gain of the transistor, while the value of C is the large signal value of the collector-to-base capacitance determined by the collector-to-base bias voltage and the RF drive level. The collector-to-base capacitance increases exponentially as the collector-to-base voltage is decreased. The RF drive causes the collector-to-base voltage to swing with large excursions around its DC value and therefore causes the collector-to-base capacitance to have an effective capacitance greater than its small signal value. The inductance in the equivalent circuit is the bonding pad and collector lead bond inductance to C4 which is RF ground. The collector-to-emitter capacitance C1 enhances the inherent collector-to-emitter capacitance and provides the additional positive feedback necessary to generate the negative resistance.

The varactor CR1 is modeled as a series resistor-capacitor circuit. The capacitor C' is the junction capacitance which is a non-linear function of tuning voltage (reverse bias) applied to the varactor. The RF drive voltage effects the average bias voltage applied to the varactor and therefore effects its effective capacitance. The varactor capacitance C' can be represented as follows:

$$C = \frac{C_j(0)}{\left[\left(\frac{C_j(0)}{C_j(0)_{EFF}}\right)^{\frac{1}{\gamma}} + \frac{V_T}{\phi}\right]^\gamma} \qquad \text{Eq 1}$$

C'—Varactor capacitance $C_j(0)$—Varactor capacitance at tuning voltage=0V with no RF Drive $C_j(0)_{EFF}$—Varactor capacitance at tuning voltage=0V with RF Drive $V_T$—Tuning voltage (reverse bias voltage)

$\phi$—Contact potential (Approx. equal 0.6V for silicon material)

$\gamma$—Junction gradient constant (0.46–0.50 for abrupt junction diodes)

The resistor, R' is the resistance of the bulk material of the varactor and the ohmic contacts to the device. This resistance is primarily from the resistivity of the epitaxial layer. As the tuning voltage is increased, this resistance decreases since the lower resistivity depletion layer widens into the higher resistivity epitaxial layer.

The components L1-L6 are transmission lines rather than discrete elements. The characteristic impedance and electrical length of a microstrip line are determined by the dimensions of the line and the material dielectric constant. Since microstrip transmission lines are distributed elements, the impedance, $Z_S$, at any point along the line is a function of the load impedance, $Z_L$, electrical length of the line, 1, and the characteristic impedance $Z_O$. For a lossless line, $$Z_S = Z_O \left( \frac{Z_L + jZ_O \tan \beta 1}{Z_O + jZ_L \tan \beta 1} \right) \quad \text{Eq 2}$$

$Z_S$=Sending end impedance
$Z_O$=Characteristic impedance of transmission line
$Z_L$=Load impedance
$\beta$=Phase constant=$2\pi$ radians per wavelength
1=Electrical length of line expressed in wavelengths For the series tuned circuit, FIG. 5, the conditions which must be met in order for oscillations to be sustained are twofold. The summation of all resistances must be zero and the summation of all reactances must be zero. To illustrate, the series resonant nature of the voltage controlled oscillator circuit, the load, $Z_L$, output attenuator, R1, filter C3 and L5 have been combined with L4 into an equivalent series impedance Z'. For circuits which employ microstrip transmission lines, the individual circuit impedances as depicted in FIG. 5 cannot simply be added. An appropriate way to express the conditions for oscillation is that at any point in the series circuit the summation of impedances to the right and left of that point must sum to zero. That is $$Z_A + Z_B = R_A + jX_A + R_B + jX_B = 0 \therefore R_A = -R_B \text{ and}$$
$$X_A = -X_B \quad \text{Eq 3}$$

For the oscillator circuit in FIG. 5, if point A were selected, $Z_A$ would essentially be the transistor impedance since L6 is relatively small and $Z_B$ would be the impedance of the varactor, transmission lines, and coupled load. In this case the negative resistance, $-R$, of the transistor must be large enough to equal the losses in the circuit due to the coupled load and varactor over the desired frequency range of oscillation. The condition that $X_A = -X_B$ will only be satisfied at the frequency of oscillation. However, the conditions specified in Equation 3 must be satisfied for all frequencies over which oscillation is to occur. This is accomplished by changing the varactor capacitance. As the tuning voltage to the varactor is increased, its capacitance decreases and therefore its reactance increases. The increase in capacitive reactance tunes the frequency of oscillation higher so that the summation of reactances remains zero. By proper selection of the transistor and varactor characteristics, and the length and impedance of the transmission line segments, the circuit in FIG. 5 can be made to oscillate over a frequency band in excess of 1 to 2GHz. An oscillator circuit was constructed in accordance with the foregoing in which the various components were as follows:

Substrate 16—Be O 0.25×0.355×0.450 inches, with 50 ohm/square tantalum nitride
Ground plane 14—Kovar, gold plated
Transistor $Q_1$—TI 112C
Varactor CR1—GC-1705-00
Capacitors C3, C4, C5, C6—1000 PF, 0.08×0.08 inch
Capacitors C2, C7—50 PF, 0.030×0.030 inch
Capacitors $C_3$ $C_1$—1.0 PF, 0.03×0.03 inches
Resistor R1A—27 ohm
Resistor R1B—105 ohm
Resistor R1C—105 ohm
Resistor R2—18 ohm
Resistor R3—5 ohm
Resistor R4—5 ohm
Resistor R5—5 ohm
Resistor R6—100 ohm
Resistor R7—100 ohm
Resistor R8—950 ohm
Resistor R9—5 ohm
Resistor R10—300 ohm
Resistor R11—5 ohm

| Inductor | RFC1 | each approximately 0.19 wavelengths long at 1GHz, $Z_o$ = 120 ohms. |
|---|---|---|
| " | RFC2 | |
| " | RFC3 | |

The circuit was operated and with the tuning voltage varied from zero to 45 volts, the oscillator frequency was varied from 1 to 2 GHz.

Thus, it is seen that there has been provided an improved voltage controlled oscillator. The microstrip circuit using chips is significantly smaller in size and lighter in weight than discrete circuits designed with packaged devices. In addition, the circuit has advantages in the areas of repeatability and reliability. Variations in the assembly procedures and performance of packaged devices used in discrete element circuit designs necessitate that each circuit be aligned to achieve the desired performance. The microstrip circuit eliminates variations from circuit assembly since the circuit is etched onto a ceramic substrate. Therefore, the repeatability of this type of circuit is significantly improved. Additionally, the number of electrical connections is significantly lower in the microstrip design compared to the discrete element design. Therefore, the reliability of the microstrip design is inherently higher than the discrete element design.

What is claimed is:

1. A thin film microwave voltage controlled oscillator having an octave tuning bandwidth comprising: a ground plane, a dielectric substrate carried by said ground plane; a transistor having emitter, collector and base terminals mounted on said substrate; a capacitor connected between said emitter and collector terminals, an emitter bias circuit connected to said emitter terminal, said bias circuit including serially connected thin film resistors and a spiral transmission line section connected between the emitter and the ground plane and a bypass capacitor connected between said series circuit and said ground plane; a base circuit connected to said base terminal, said base bias circuit including a voltage divider comprising thin film resistors, and means including a spiral transmission line section connected between said base and the voltage divider and a bypass capacitor connected between the voltage divider and the ground plane; a varactor supported on said substrate, said varactor having one terminal serially coupled to said base terminal through a blocking capacitor; means including a serial spiral transmission line for applying a tuning voltage to the one terminal of said varactor; and an output circuit connected between the other terminal of said varactor and the ground plane, said output circuit forming an output coupling means for coupling the oscillator to an associated load, said thin film resistors being tantalum nitride films supported on said substrate and said spiral transmission lines and resistors being formed by selective etching of thin film layers formed on the dielectric substrate said layers comprising in order a tantalum nitride layer, a conductive barrier layer and a conductive surface layer.

2. An oscillator as in claim 1 in which said ground plane and substrate are mounted in a metal housing.

* * * * *